(12) United States Patent
Fukuda

(10) Patent No.: US 6,822,496 B2
(45) Date of Patent: Nov. 23, 2004

(54) INTEGRATED CIRCUIT DEVICE IMPLEMENTING 90-DEGREE PHASE SHIFTER CAPABLE OF GENERATING OUTPUT SIGNALS HAVING PHASE DIFFERENCE THEREBETWEEN AT IMPROVED ACCURACY

(75) Inventor: Takeshi Fukuda, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/337,047

(22) Filed: Jan. 3, 2003

(65) Prior Publication Data

US 2003/0151439 A1 Aug. 14, 2003

(30) Foreign Application Priority Data

Jan. 8, 2002 (JP) ........................................ 2002-001795

(51) Int. Cl.[7] .......................... H03H 11/16; H03K 5/13
(52) U.S. Cl. ..................... 327/238; 327/252; 327/255
(58) Field of Search .............................. 327/231, 237, 327/238, 252, 253, 254, 255, 257, 258, 552, 558; 333/118, 156

(56) References Cited

U.S. PATENT DOCUMENTS 6,211,708 B1 * 4/2001 Klemmer .................... 327/122
6,236,847 B1 * 5/2001 Stikvoort .................... 455/313
6,456,167 B1 * 9/2002 Huang ........................ 331/46
6,577,691 B2 * 6/2003 Richards et al. ............ 375/355
6,587,017 B1 * 7/2003 Sheng et al. ................ 333/139

FOREIGN PATENT DOCUMENTS

| JP | 11-298293 | 10/1999 |
|----|-----------|---------|
| JP | 2001-045080 | 2/2001 |

OTHER PUBLICATIONS

US 2003/0117200 A1, Koh et al., Jun. 26, 2003.*

US 2003/0067357 A1, Lin et al., Apr. 10, 2003.*

US 2003/0119470 A1, Persico Jun. 26, 2003.*

* cited by examiner

*Primary Examiner*—Tuan T. Lam

(57) ABSTRACT

Disclosed is an integrated circuit device in which a 90-degree phase shifter is implemented. The 90-degree phase shifter includes four input capacitors all having equal capacitance and four output capacitors all having equal capacitance. The input capacitors and the output capacitors are alternately arranged in a loop-shape array in plan view. Eight resistors of the 90-degree phase shifter are arranged inside the annular shape in which the capacitors are arranged.

11 Claims, 7 Drawing Sheets

THIRD LAYER

SECOND LAYER

} FIRST LAYER

RESISTOR

WIRING

INTEGRATED CIRCUIT DEVICE IMPLEMENTING 90-DEGREE PHASE SHIFTER CAPABLE OF GENERATING OUTPUT SIGNALS HAVING PHASE DIFFERENCE THEREBETWEEN AT IMPROVED ACCURACY

This application is based on an application No. 2002-001795 filed in Japan, the content of which is hereby incorporated by reference.

BACKGROUND OF THE INVENTION (1) Field of the Invention

The present invention relates to a circuit layout of an integrated circuit device in which a 90-degree phase shifter is implemented. More particularly, the present invention relates to a technique for enhancing accuracy in phase difference between output signals.

(2) Description of the Related Art

Due to the expanding use of information and communications technologies such as the Internet, there is a growing demand for broader bandwidth in radio communications. As a result, there also is a great demand for 90-degree phase shifters that effectively operate at high frequencies. In addition, as typified by cellular phones, it is strongly desired to down-size radio communications devices. Consequently, it is required that a 90-dgeree shifter be small enough to be packed into an integrated circuit device.

To integrate a 90-degree phase shifter, for example, a 90-degree phase shifter having a circuit structure as shown in FIG. 2 is implemented on an integrated circuit device with a circuit layout as shown in FIG. 1.

FIG. 2 is a circuit diagram showing the circuit structure of a 90-degree phase shifter which receives a differential signal from an oscillator through an input terminal IN, and generates two differential signals having a 90-degree phase difference therebetween to output through two output terminals OUT1 and OUT2. FIG. 1 shows the circuit layout of the integrated circuit device at a portion corresponding to the 90-degree phase shifter.

Unfortunately, a conventional integrated circuit device as mentioned above has a problem. That is, when an input to the input terminal IN is made at high-frequencies of some GHz or higher, output signals from the output terminals OUT 1 and OUT 2 no longer have a 90-degree phase difference therebetween. Accordingly, it is said that the performance of a 90-degree phase shifter implemented as in a conventional manner is insufficient.

Here, it should be noted that even for the sake of eliminating the above problem, it is not desirable at all to upsize an integrated circuit device in which a 90-degree phase shifter is implemented in view of the above-mentioned demand for down-sizing radio communications devices.

SUMMARY OF THE INVENTION

In view of the above problem, an object of the present invention is to provide an integrated circuit device in which a 90-degree phase shifter is implemented in a manner that the 90-degree phase shifter accurately generates output signals with 90-degree phase difference therebetween even in high-frequency range. In addition, the above object must be achieved without upsizing the integrated circuit device.

The above-stated object is achieved by an integrated circuit device in which a 90-degree phase shifter is implemented. The 90-degree phase shifter includes four input capacitors all having equal capacitance and four output capacitors all having equal capacitance. Here, the input capacitors and the output capacitors are arranged alternately in a loop-shape array in plan view.

With this construction, wiring lengths of circuit components are made approximately all equal, and the wiring lengths are shortened. Consequently, it is achieved to suppress parasitic electromagnetic coupling between wires or between a wire and the circuit substrate, which leads to higher accuracy in output signals.

Note that the "loop-shape" is also referred to as an "annular shape" in the description below. The term "annular" used herein refers to any shape that forms a loop, and thus includes, for example, a ring shape, a square shape, and a rectangular shape as long as a line connecting the arranged circuit components draws a loop.

Further, each input capacitor may be connected to one of the output capacitors electrically in series without any other circuit component therebetween, and each input capacitor and an output capacitor connected to the input capacitor may be arranged next to each other in the loop-shape array.

With this construction, it is achieved to make wiring lengths of capacitors approximately equal and shorter. Consequently, accuracy of the 90-degree phase shifter is improved so that output signals are obtained with higher accuracy.

Further, the 90-degree phase shifter may include four input resistors and four output resistors, and the input resistors and the output resistors may be all arranged inside the loop-shape array.

With this construction, wiring lengths between a capacitor and a resistor as well as between resistors are made approximately all equal. In addition, the wiring lengths are shortened. Consequently, accuracy of the phase shifter is improved so that output signals are obtained with higher accuracy.

Further, each input resistor may be connected to one of the output resistors electrically in series without any other circuit component therebetween, and each input resistor and an output resistor connected to the input resistor may be arranged in spatial proximity to each other. Each input resistor may be spatially closer to an input capacitor than a corresponding output resistor is to the input capacitor.

With this construction, it is achieved to shorten wiring lengths between a capacitor and a resistor as well as between resistors that are directly related to each other. Consequently, accuracy of the phase shifter is improved.

Further, each input resistor may be connected to one of the output resistors electrically in series without any other circuit component therebetween, and each input resistor and an output resistor connected to the input resistor may be in spatial proximity to each other. Each output resistor may be spatially closer to an output capacitor than a corresponding input resistor is to the output capacitor.

With this construction, similarly to the above stated arrangement, it is achieved to shorten wiring lengths between a capacitor and a resistor as well as between resistors that are directly related to each other. Consequently, accuracy of the phase shifter is improved. In addition, the phase shifter is made compact, and thus the integrated circuit device in which the 90-degree phase shifter is implemented is made compact.

Further, the four input resistors may all have equal resistance, and the four output resistors may all have equal resistance.

With this construction, it is easier to adjust arrangement of the resistors within the area encircled by the loop-shape array of the eight capacitors, so that it is easier to make wiring lengths of circuit components approximately equal.

Further, as a concrete circuit structure, the 90-degree phase shifter may include an input loop circuit and an output loop circuit. The input loop circuit may be formed by the four input capacitors and four input resistors that are electrically looped in series in an order of a first input resistor, a first input capacitor, a second input resistor, a second input capacitor, a third input resistor, a third input capacitor, a forth input resistor, and a forth input capacitor. The output loop circuit may be formed by the four output capacitors and four output resistors that are electrically looped in series in an order of a first output resistor, a first output capacitor, a second output resistor, a second output capacitor, a third output resistor, a third output capacitor, a fourth output resistor, and a forth output capacitor. A node between the fourth input capacitor and the first input resistor may be electrically connected to a node between the first output resistor and the first output capacitor. A node between the first input capacitor and the second input resistor may be electrically connected to a node between the second output resistor and the second output capacitor. A node between the second input capacitor and the third input resistor may be electrically connected to a node between the third output resistor and the third output capacitor. A node between the third input capacitor and the fourth input resistor may be electrically connected to a node between the forth output resistor and the forth output capacitor. A node between the second input resistor and the second input capacitor may be electrically connected to a node between the forth input resistor and the forth input capacitor.

Alternatively, with a focus on the integration of a 90-degree phase shifter, the above-stated object of the present invention is achieved by an integrated circuit device in which a 90-degree phase shifter is implemented. The 90-degree phase shifter includes a plurality of capacitors and a plurality of resistors. Each of the plurality of capacitors is composed of a pair of electrodes. The pair of electrodes is arranged to be opposed to each other in a laminating direction. Each of the plurality of resistors is composed of a pair of electrodes. The pair of electrodes is arranged to be opposed to each other with a resistance film sandwiched therebetween. Here, the capacitors and the resistors together form an input shifter and an output shifter that are cascaded. The capacitors constituting the input shifter and the capacitors constituting the output shifter are alternately arranged in a loop-shape array in plan view. The resistors constituting the input shifter and the resistors constituting the output shifter are arranged inside the loop-shape array in radial symmetric relation.

With the stated implementation of a 90-degree phase shifter on the integrated circuit device, accuracy of the 90-degree phase shifter is improved.

Further, each capacitor constituting the input shifter may be taken as a pair with one of the capacitors constituting the output shifter and each pair of capacitors may be next to each other on the substrate. Each pair of capacitors may be connected to each other in series by a lower-positioned electrode of one capacitor being connected to an upper-positioned electrode of the other capacitor with a via.

With the stated implementation, a distance between capacitors arranged to be adjacent in the array is shortened, which achieves higher packing density.

Further, the loop-shape array in which the capacitors are arranged may be a square in plan view with the capacitors arranged three by three on each side of the square.

With the stated implementation, among three capacitors arranged on one side of the square, the capacitor in the middle is the one constituting the input shifter and arranged in proximity to an input resistor. Alternatively, the middle capacitor may be the one constituting the output shifter and arranged in proximity to an output resistor. Consequently, the overall wiring lengths are shortened, which leads to improve accuracy of the 90-degree phase shifter.

Further, the 90-degree phase shifter may include a square-shaped conductive land arranged centrally of the square area encircled by the capacitors. The resistors may be so arranged that each area between a side of the conductive land and a capacitor located outward the side includes two resisters connected to each other in series. Here, one of the two resistors may be a resistor constituting the input shifter and the other may be a resistor constituting the output shifter.

With the resistors arranged as stated above, it is achieved to shorten wiring lengths between resistors as well as between a capacitor and a resistor. Consequently, accuracy of the 90-degree phase shifter is improved.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT

Now, description is given to one embodiment of an integrated circuit device according to the present invention with reference to accompany drawings.

The integrated circuit device of this embodiment is constructed by integrating a 90-degree phase shifter. Description of the integrated circuit device is first given to the circuit structure, and then to the circuit layout.

<Circuit Structure>

Figure 1:
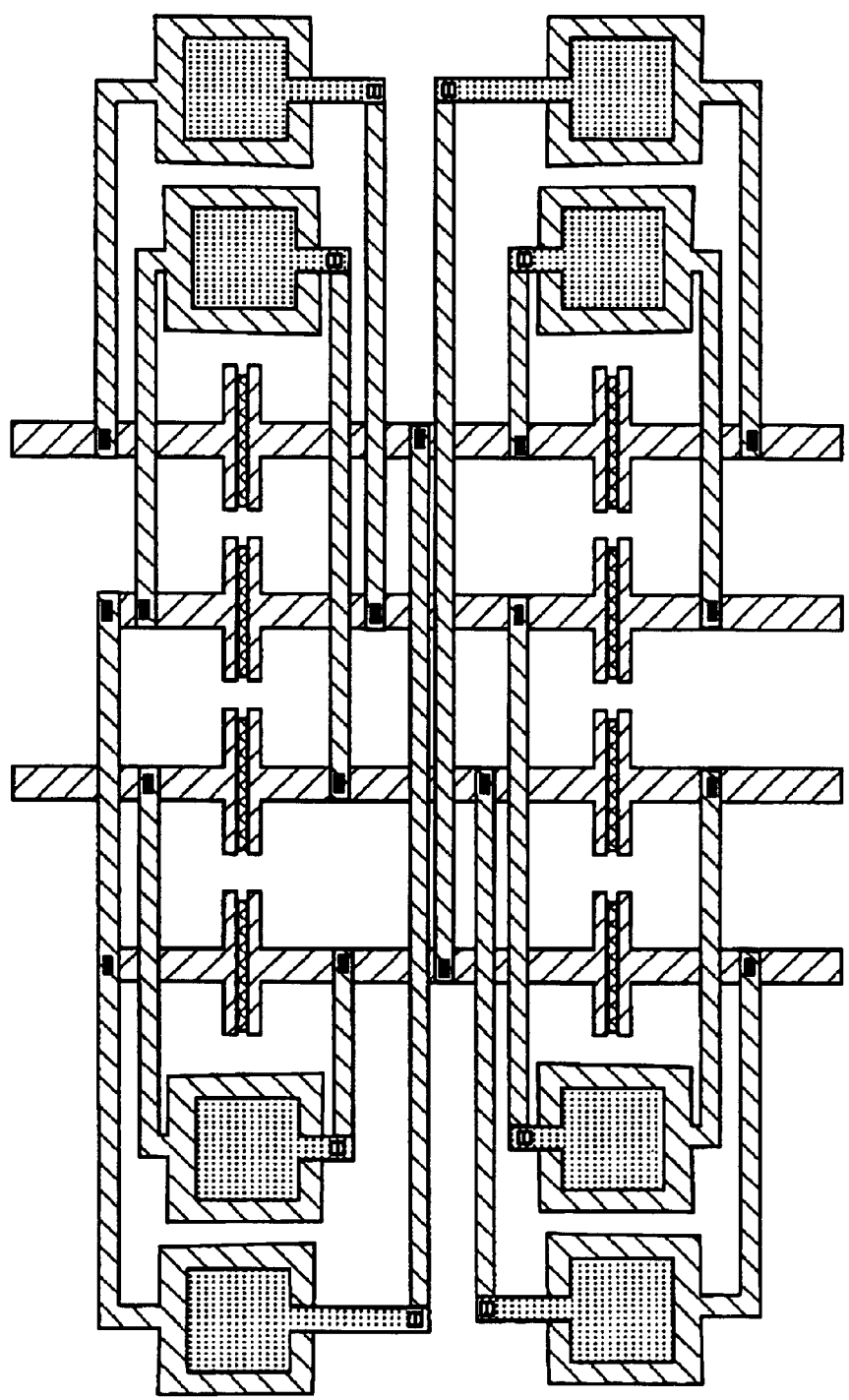
FIG. 1 is a view showing a conventional circuit layout of an integrated circuit device in which a 90-degree phase shifter is implemented.
Figure 2:
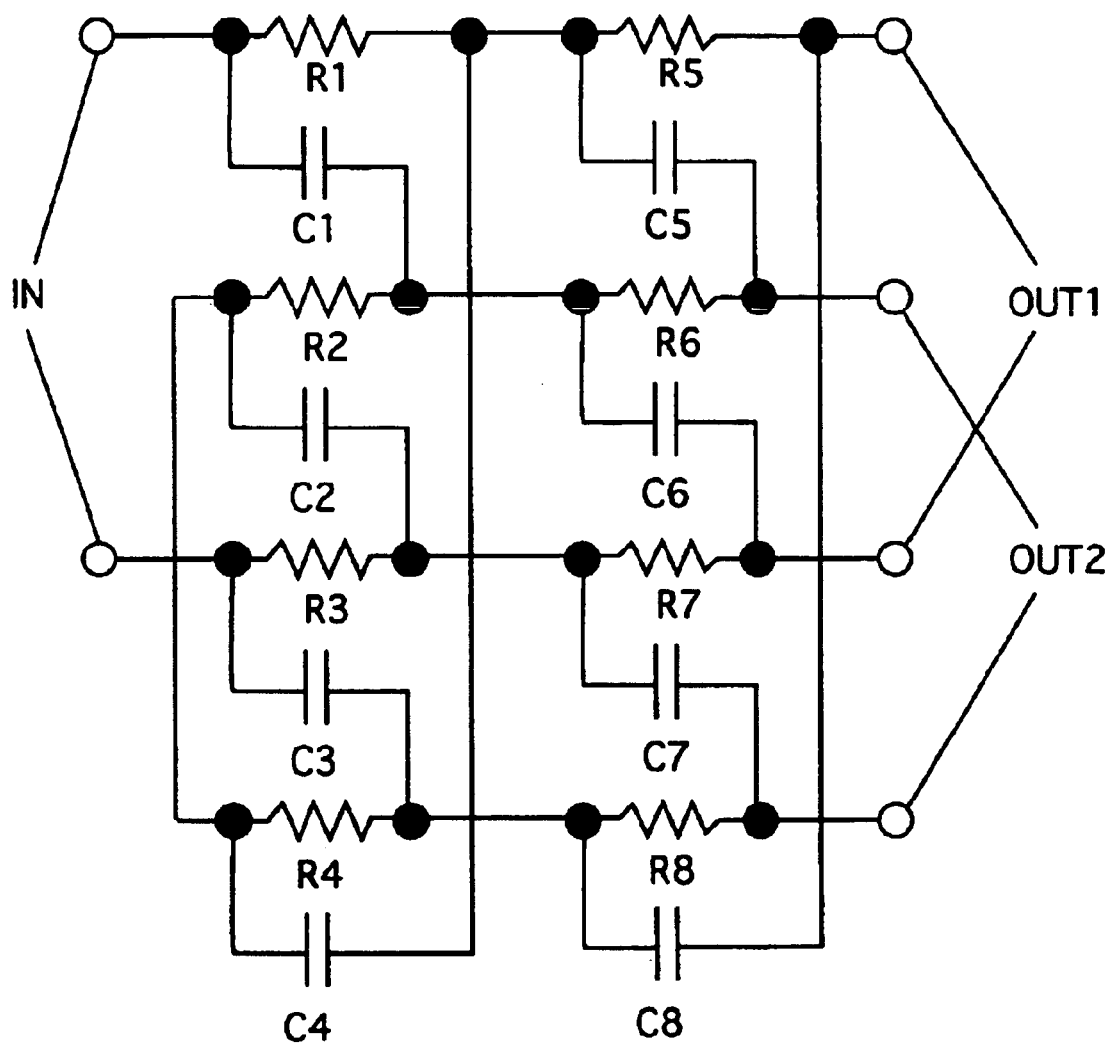
FIG. 2 is a circuit diagram showing the circuit structure of a 90-degree phase shifter implemented on an integrated circuit device according to an embodiment of the present invention.

FIG. 2 shows the circuit structure of a 90-degree phase shifter implemented on the integrated circuit device. As shown in the figure, the 90-degree phase shifter is composed of eight resisters R1–R8 and eight capacitors C1–C8. Hereinafter, four of the capacitors C1–C4 are referred to as input capacitors and the other four capacitors C5–C8 are referred to as output capacitors. Similarly, four of the resistors R1–R4 are referred to as input resistors and the other four resistors R5–R8 are referred to as output resistors.

In the 90-degree phase shifter 1 shown in FIG. 2, the resistor R2 and the capacitor C1 together forms an RC circuit. Similarly, each pair of the resistor R3 and the capacitor C2, the resistor R4 and the capacitor C3, the resistor R1 and the capacitor C4 forms an RC circuit. The thus formed four RC circuits are connected in series to form a loop, thereby constituting an input circuit (so-called input phase shifter)

Note that in the input circuit, a node between the resistor R2 and the capacitor C2 is connected to a node between the resistor R4 and the capacitor C4. In addition, a node between the resistor R1 and the capacitor C1 as well as a node between the resistor R3 and the capacitor C3 are separately connected to a differential input terminal IN.

Further, each pair of the resistor R6 and the capacitor C5, the resistor R7 and the capacitor C6, and the resistor R8 and the capacitor C7, the resistor R1 and the capacitor C8 forms an RC circuit. The thus formed four RC circuits are connected in series to form a loop, thereby constituting an output circuit (so-called output phase shifter). As described above, the 90-degree phase shifter according to the present embodiment is composed of two cascaded stages, the input circuit and the output circuit.

Note that in the output circuit, each node between two RC circuits is connected to an output terminal. To be more specific, a node between the capacitor C8 and the resistor R5 as well as a node between the capacitor C6 and the resistor R7 are separately connected to a differential output terminal OUT1. In addition, a node between the capacitor C5 and the resistor R6 as well as a node between the capacitor C7 and the resistor R8 are separately connected to one of a differential output OUT2.

Further, the input circuit and the output circuit are connected to each other with four pointes. To be more specific, a node between the resistor R1 and the capacitor C4 is connected to a node between the resistor R5 and the capacitor C5, a node between the resistor R2 and the capacitor C1 is connected to anode between the resistor R6 and the capacitor C6, anode between the resistor R3 and the capacitor C2 is connected to the resistor R7 and the capacitor C7, and a node between the resistor R4 and the capacitor C3 is connected to a node between the resistor R8 and the capacitor C8.

In the input circuit, the resistors R1–R4 all have an equal resistance (61 Ω), and the capacitors C1–C4 all have an equal capacitance (0.5 pF) Similarly, in the output circuit, the resistors R5–R8 all have an equal resistance (61 Ω), and the capacitors C5–C8 all have an equal capacitance (0.5 pF). The design frequency of the 90-degree phase shifter is 5 GHz.

<Circuit Layout>

Next, description is given to the circuit layout of circuit components of the 90-degree shifter implemented on the integrated circuit device. In other words, description is given to the spatial layout of the capacitors C1–C8 and the resistors R1–R8.

Figure 3:
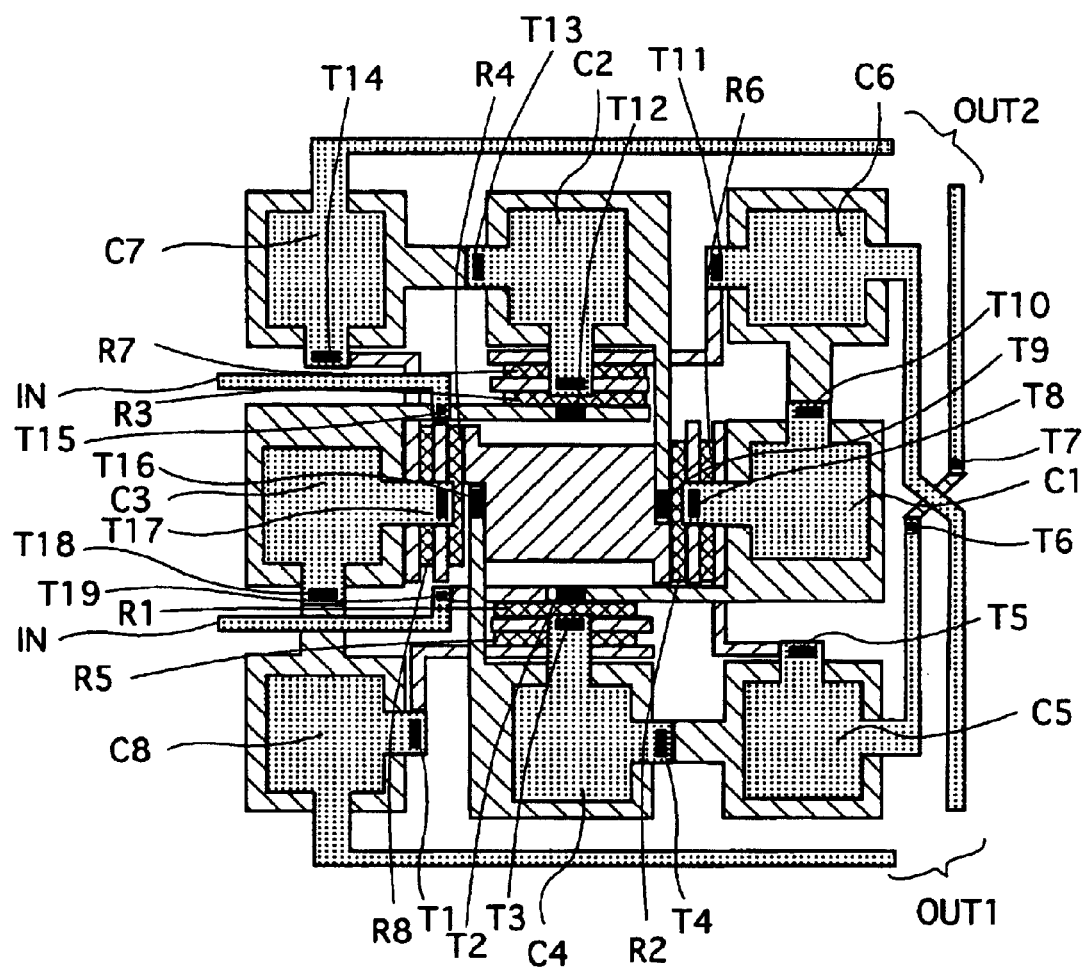
FIG. 3 is a view showing the circuit layout of the integrated circuit device of the embodiment in which the 90-degree shifter is implemented.
Figure 3:
Figure 3:
Figure 3:

FIG. 3 is a plan view of the integrated circuit device of this embodiment showing a portion corresponding to the 90-degree shifter. In the figure, the 90-degree phase shifter as a whole occupies a substantially square area (160 µm by 160 µm). In addition, the 90-degree phase shifter has a three-layer structure, and each layer is electrically connected with vias T1–T19 as necessary. Hereinafter, the three layers are referred to as a first layer, a second layer, and a third layer, respectively, in the order closer to a substrate layer.

The capacitors C1–C8, in plan view, are arranged annularly along the periphery of the substantial square area, and three capacitors are arranged on each side of the substantially square area. Further, the input capacitors C1–C4 and the output capacitors C5–C8 are arranged alternately along the annular shape. In addition, as shown in the circuit diagram of FIG. 2, each input capacitor is connected to one of the output capacitors in series directly, i.e., without any other circuit component between them, and each input capacitor and an output capacitor directly connected to the input capacitor are arranged to be next to each other along the annular shape.

For example, the input capacitor C1 and the output capacitor C6 are connected in series without any other circuit component between them, so that the two capacitors are arranged to be next to each other as shown in FIG. 3. The same description applies to the other capacitors. That is, the input capacitor C2 and the output capacitor C7, the input capacitor C3 and the output capacitor C8, the input capacitor C4 and the output capacitor C5 are arranged to be next to each other along the annular shape.

Further, when exclusively mentioning the input circuit, the input capacitors are arranged along the annular shape in the order of C1, C2, C3, and C4. This arrangement of the input capacitors is in agreement with that of the input circuit shown in the circuit diagram of FIG. 2 where the input capacitors are arranged to electrically form a loop. Similarly, the output capacitors are arranged in the order of C5, C6, C7, and C8, and this arrangement of the output capacitors is in agreement with that of the output circuit shown in the circuit diagram in FIG. 2 where the output capacitors are arranged to electrically form a loop.

As described above, the circuit shown in FIG. 2 is structured in a manner that the input capacitors C1–C4 and the output capacitors C5–C8 are arranged in radial symmetric relation. With this arrangement, wiring lengths of corresponding capacitors are approximately all equal, which serves to suppress undesirable deviation in phase of a signal passing through each wiring. In addition, the above arrangement serves to shorten overall wiring lengths, so that the resulting integrated circuit device will be of compact in size.

Next, description is given to the circuit layout of the resistors. The resistors R1–R8 are arranged inside the annular shape defined by the capacitors C1–C8. To be more specific, as shown in FIG. 3, the output capacitors C5–C8 are each arranged in a corner of the substantially square area that the 90-degree phase shifter occupies. Each of the input capacitors C1–C4, is arranged between two of the capacitors C5–C8. The resistors R1–R8 are arranged on a line connecting the input capacitors C1 and C3 or the input capacitors C2 and C4.

That is, the resistors R6 and R2 are arranged in proximity to each other on the connecting line and in an area that is inwardly adjacent to the input capacitor C1. Similarly, the resistors R7 and R3 are arranged in proximity to each other on the connecting line and in an area that is inwardly adjacent to the input capacitor C3, and the resistors R5 and R1 are arranged in proximity to each other on the connecting line and in an area that is inwardly adjacent to the input capacitor C4. Note that each of the input resistors R1–R4 is arranged to be closer to a corresponding one of the input capacitors C1–C4 than a corresponding one of the output resistors R5–R8 is.

As described above, each of the resistors R1–R4 of the input circuit and each of the resistors R5–R8 of the output circuit are arranged in radial symmetric relation within the area encircled by the capacitors C1–C8. In addition, two resistors that are shown in the circuit diagram of FIG. 2 to be electrically connected to each other in series without any other electric component are arranged to be in spatial proximity to each other.

For example, the resistors R1 and R5 are taken as a pair as they are connected to each other in series without any other circuit component therebetween. Thus, the resistors R1 and R5 are in proximity to each other in the circuit layout shown in FIG. 3. This description also applies to a pair of the resistors R2 and R6, a pair of the resistors R3 and R7, and a pair of the resistors R4 and R8.

In the middle of the substantially square area, there is arranged a rectangular conductive land (on a first layer in this case). Each pair of the resistors is arranged in a small area between one of the four sides of the conductive land and a corresponding one the capacitors that are located outwardly to the conductive land. This arrangement makes it possible to adjust resistance of each resistor by adjusting the size of the conductive land accordingly, rather than by changing the circuit area size.

In addition to the above description, to be noted in FIG. 3 is that one end of the differential input terminal IN extends from a midpoint between the capacitor C1 and the resistor R1, and the other end of the differential input terminal IN extends from a midpoint between the capacitor C3 and the resistor R3. Owing to this arrangement, the wiring length forming each end of the input terminal IN is approximately equal to each other. This helps to reduce distortion in the waveforms of input signals.

Referring now to the differential output terminals, both ends of the differential output terminal OUT1 extend from the capacitors C6 and C8, respectively, so that the wiring length forming each end is approximately equal to each other. In addition, both ends of the differential output terminal OUT2 extend from the capacitors C5 and C7, respectively, so that the wiring length forming each end is approximately equal to each other. This arrangement helps to reduce waveform distortion in output signals of the differential terminal OUT1 and OUT2.

Figure 4:
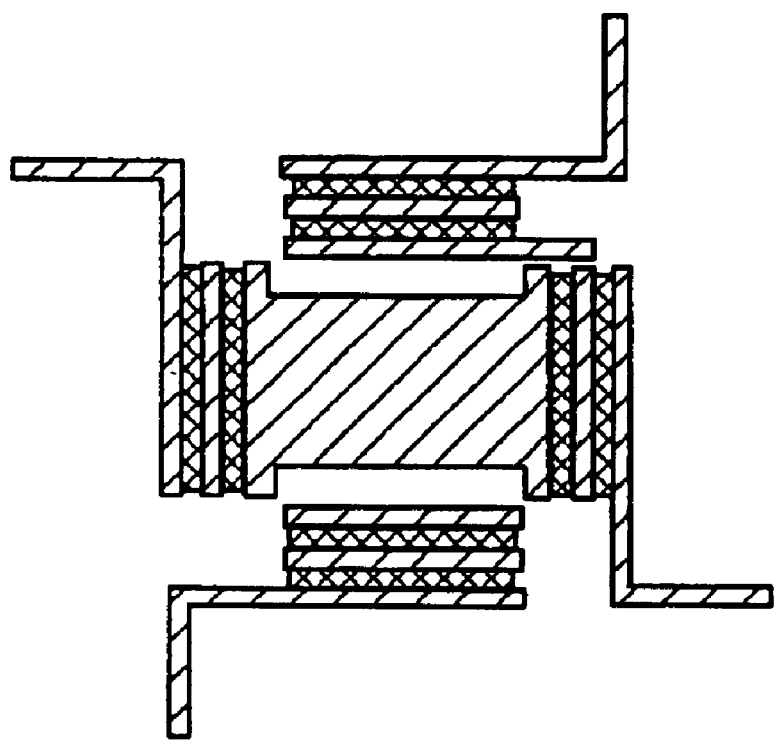
FIG. 4 is a view showing the circuit pattern of the first layer of the 90-degree phase shifter that is implemented on the integrated circuit device by multilayer integration.
Figure 4:
Figure 4:

FIG. 4 is a view showing the circuit pattern of the first layer. As shown in the figure, the diagonally shaded area represents a conductive part having a relatively small resistance, while the cross-hatched area represents a conductive part having a relatively large resistance. All the resistors R1–R8 (the cross-hatched areas) are arranged on the first layer. Each resistor is composed of two electrodes layered on the diagonally-shaded area with a resistance film sandwiched therebetween. In other words, each resistor is composed of two electrodes opposing to each other in a direction parallel to the substrate layer with a resistance film sandwiched therebetween.

Figure 5:
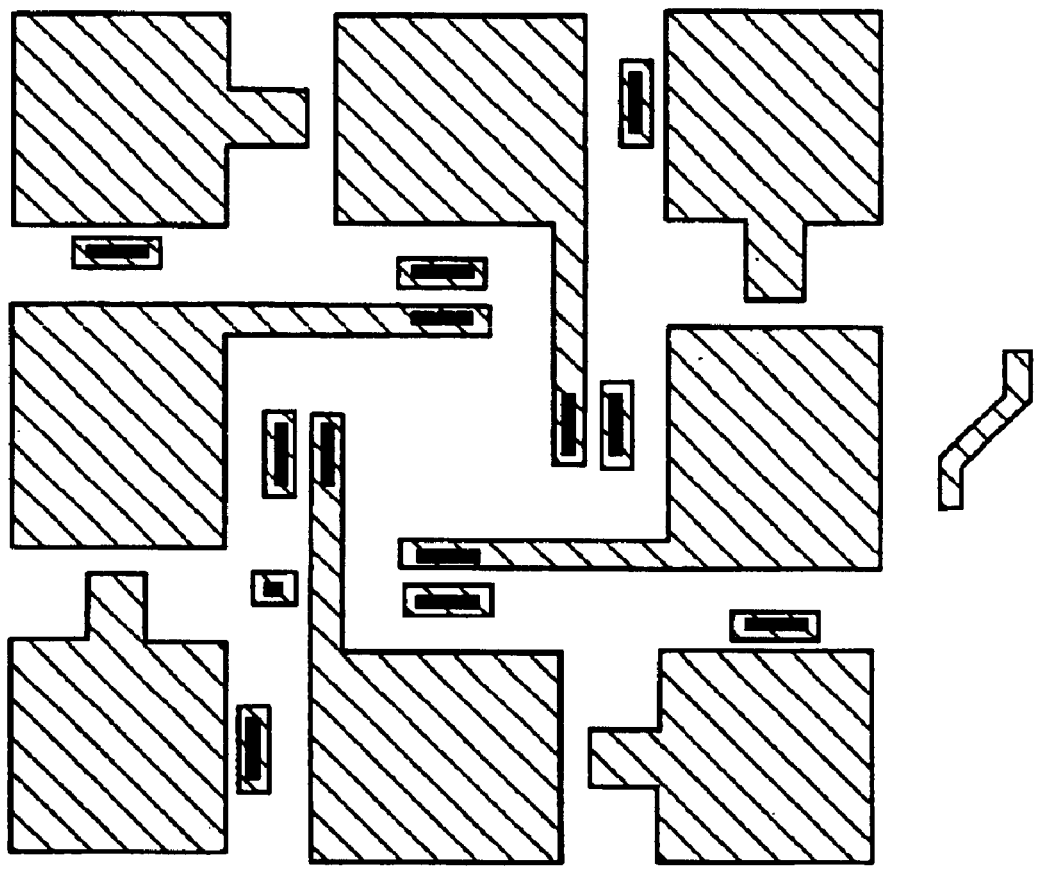
FIG. 5 is a view showing the circuit pattern of the second layer of the 90-degree phase shifter that is implemented on the integrated circuit device by multilayer integration.

FIG. 5 is a view showing the circuit pattern of the second layer. In the figure, the second layer includes eight substantially square, conductive portions along the peripheral area of the second layer, and a wire extends from each of the conductive portions. Each conductive portion acts as one of the electrodes each of which constitutes the capacitors C1–C8.

Figure 6:
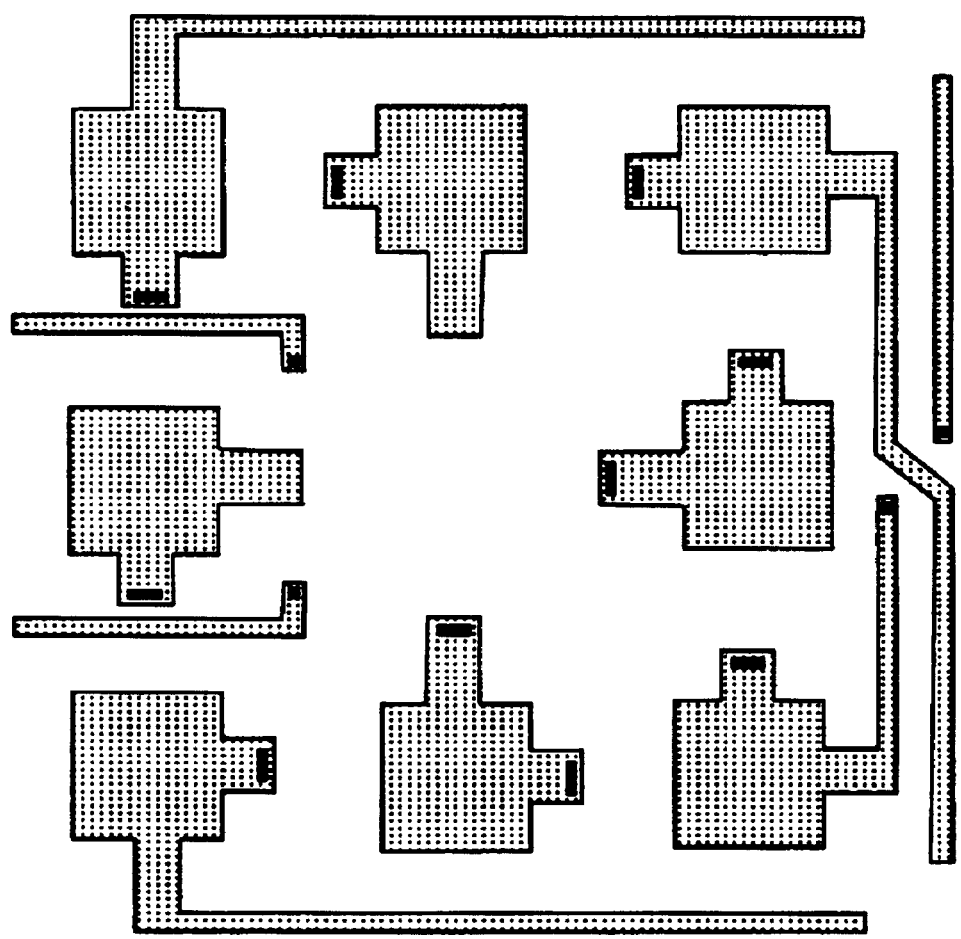
FIG. 6 is a view showing the circuit pattern of the third layer of the 90-degree phase shifter that is implemented on the integrated circuit device by multilayer integration.

FIG. 6 is a view showing the circuit pattern of the third layer. In the figure, the third layer includes eight substantially square, conductive portions along the peripheral area of the third layer, and each conductive portion is provided with wiring pattern around it. The conductive portions are at locations corresponding to the conductive portions formed on the second layer so that each conductive portion makes a pair with a conductive portion located in the laminating direction. Those pairs of conductive portions constitute capacitors C1–C8.

That is, each of the capacitors C1–C8 is composed of two substantially square, conductive portions, one formed on the second layer and the other formed on the third layer, acting as a pair of electrodes opposing in the laminating direction. Each capacitor has capacitance corresponding to the size of the conductive portion (i.e., electrode) formed on the second layer.

The 90-degree shifter implemented in the integrated circuit device according to the present invention is manufactured by forming the above-described first to third layers in the stated order on the substrate layer. Note that each pattern shown in FIGS. 4–6 represents a conductive portion. Portions other than the conductive portions are insulated as they are made of an insulating material. In addition, the layers are insulated from each other with an insulating material, and electrically connected only at necessary portions with vias T1–T19.

With the above circuit layout, the four wiring lengths are approximately all equal between the resistor RI and the capacitor C1, between the resistor R2 and the capacitor C2, between the resistor R3 and the capacitor C3, and between the resistor R4 and the capacitor C4.

With the above circuit layout, in addition, the four wiring lengths are approximately all equal between the resistor R5 and the capacitor C5, between the resistor R6 and the capacitor C6, the resistor R7 and the capacitor C7, and between the resistor R8 to the capacitor C8.

With the above circuit layout, in addition, corresponding wiring lengths in the 90-degree phase shifter are approximately equal to each other. This helps to prevent undesirable deviation in phase resulting from difference in wiring lengths of corresponding components. Consequently, accuracy of the 90-degree phase shifter is improved.

The above layout, in addition, serves to shorten wiring lengths between components as well as to avoid wiring on different layers to be crossed. This helps to suppress parasitic electromagnetic coupling between wires or between a wire and the circuit substrate. Consequently, accuracy of the 90-degree phase shifter is improved.

<Modifications>

Up to this point, the present invention has been described by way of the above embodiment. Yet, it is naturally understood that the present invention is not limited to the specific embodiment disclosed above and various modifications such as below may be made.

(1) In the above embodiment, the description is given to a 90-degree phase shifter having the circuit structure shown in FIG. 2. However, the present invention may be also applied to a 90-degree phase shifter having the circuit structure shown in FIG. 7 to achieve the same effect.

Figure 7:
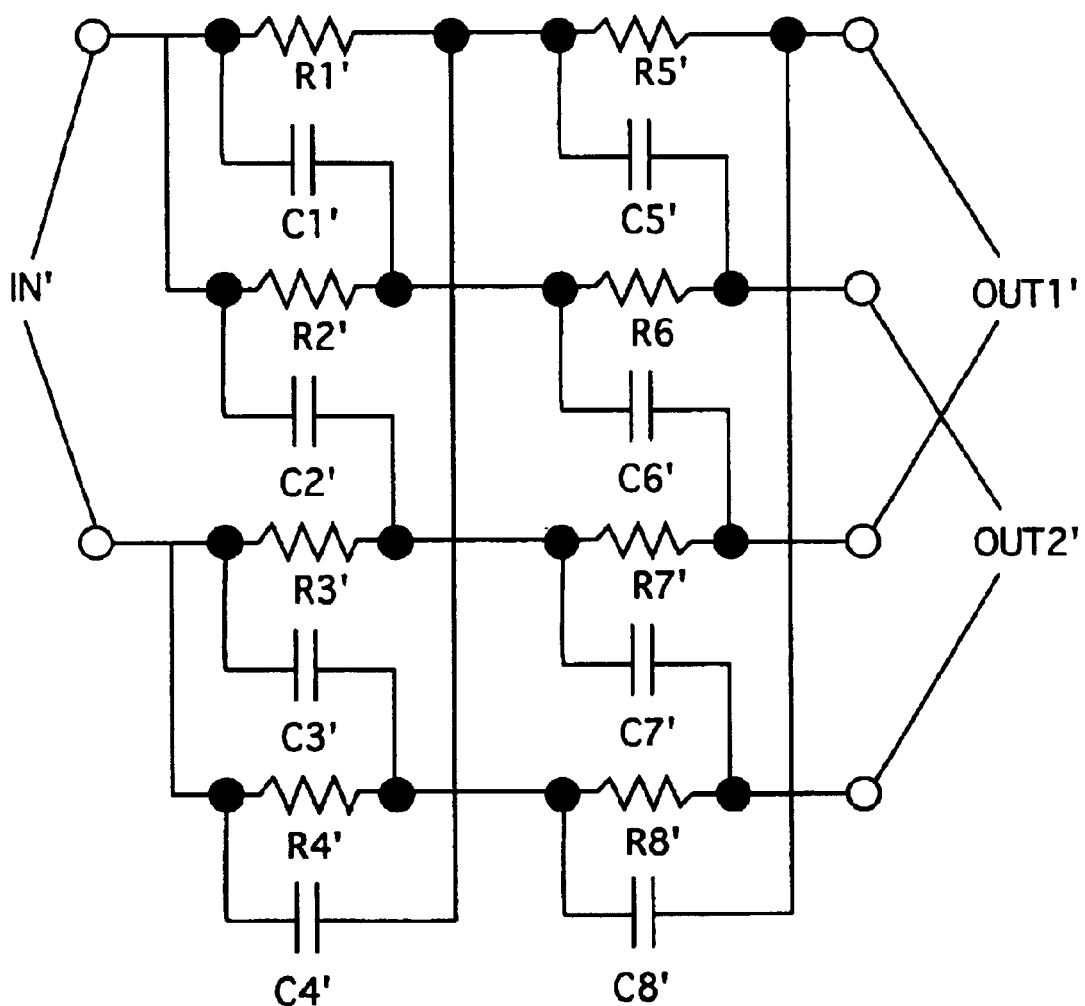
FIG. 7 is a circuit diagram showing the circuit structure of a 90-degree shifter according to one modification of the present invention.

FIG. 7 is a circuit diagram showing the circuit structure of the 90-degree shifter of the present invention. As shown in the figure and similarly to the 90-degree phase shifter 1, the 90-degree phase shifter 2 is composed of an input circuit and an output circuit. The input circuit includes a differential input terminal IN', and the output circuit includes differential output terminals OUT1' and OUT2'. The input circuit also includes four input capacitors C1'–C4' and four output resistors R1'–R4', and the output circuit also includes four output capacitors C5'–C8' and four output resistors R5'–R8'.

Similarly to the 90-degree phase shifter 1, the input circuit of the 90-degree phase shifter 2 is composed of four RC circuits, i.e., an RC circuit formed with the resistor R2' and the capacitor C1', an RC circuit formed with the resistor R3' and the capacitor C2', an RC circuit formed with the resistor R4' and the capacitor C3', and an RC circuit formed with the resistor R1' and the capacitor C4'. These RC circuits are connected in series to altogether form a loop circuit.

Unlike the 90-degree shifter 1, anode between the resistor R1' and the capacitor C1' is connected to a node between the resistor R2' and the capacitor C2'. In addition, one end of the differential input terminal IN' is connected to either of the nodes. Similarly, a node between the resistor R3' and the capacitor C3' is connected to a node between the resistor R4' and the capacitor C4'. In addition, the other end of the differential input terminal IN' is connected to either of the nodes.

Similarly to the 90-degree phase shifter 1, the output circuit of the 90-degree phase shifter 2 is composed of four RC circuits, i.e., an RC circuit formed with the resistor R6' and the capacitor C5', an RC circuit formed with the resistor R7' and the capacitor C6', an RC circuit formed with the resistor R8' and the capacitor C7', and an RC circuit formed with the resistor R5' and the capacitor C8'. Theses RC circuits are also connected in series to altogether form a loop circuit.

In addition, each node between the RC circuits is connected to one end of the differential output terminal OUT1 or OUT2. To be more specific, a node between the capacitor C8' and the resistor R5' and a node between the capacitor C6' and the resistor R7' are separately connected to a different end of the differential output terminal OUT1', while a node between the capacitor C5' and the resistor R6' and a node between the capacitor C7' and the resistor R8' are separately connected to different end of the differential output terminal OUT2'.

The input circuit and the output circuit of the 90-degree phase shifter 2 are connected to each other with four points. That is, a node between the resistor R1' and the capacitor C4' is connected to a node between the resistor R5' and the capacitor C5'. In addition, a node between the resistor R2' and the capacitor C1' is connected to a node between the resistor R6' and the capacitor C6'. In addition, a node between the resistor R3' and the capacitor C2' is connected to a node between the resistor R7' and the capacitor C7'. In addition, the node between the resistor R4' and the capacitor C3' is connected to a node between the resistor R8' and the capacitor C8'.

With the implementation to an integrated circuit device using the circuit layout according to the present invention, the 90-degree phase shifter 2 having the stated structure is capable of generating output signals with accurate phase difference therebetween.

(2) In the above embodiment, the resistors are arranged inside the annular shape, in plan view, along which the capacitors are arranged. Instead, the resistors may be arranged outside the annular shape. With the capacitors arranged according to the layout of the present invention, the resulting 90-degree phase shifter still achieves higher accuracy than a conventional 90-degree phase shifter.

(3) In the above embodiment, the circuit components of the 90-degree phase shifter are connected as shown in FIG. 3 to the differential input terminal IN and the differential output terminals OUT1 and OUT2. However, a wiring pattern other than the one shown in FIG. 3 may be applicable.

A different wiring pattern other than the one shown FIG. 3 is applicable as long as wiring lengths from circuit components to a differential input terminal IN are approximately all equal, and wiring lengths from circuit components to differential output terminals OUT1 and OUT2 are approximately all equal.

(4) In the above embodiment, the wiring pattern shown in FIG. 3 is merely one example, and changes may be made as necessary. The effect of the present invention may still be achieved by a wiring pattern with layout or size that is not precisely the same as the one shown in FIG. 3.

In addition, it is not required that each resistor be provided with a resister film. Rather, each resister may make a user of resistance that is naturally in a wiring pattern. Similarly, each capacitor is not limited to the one disclosed above as long as the function of the capacitor is fulfilled. Even with different resistors and capacitors, the above layout achieves the effect of the present invention.

(5) In the above embodiment, the description is given to the arrangement of the resistors in the case where the output capacitors C5–C8 are arranged at corners of the substantially square area. Instead of the above arrangement, however, the resistors may be arranged as follows.

That is, similarly to the above embodiment, the resistors R1–R8 are arranged inside the annular shape along which the capacitors C1–C8 are arranged. The difference lies in that the capacitors to be located at corners of the substantially square area are not the output capacitor C5–C8, but the input capacitors C1–C4. The output capacitors C5–C8 are arranged between the capacitors C1–C4. The resistors R1–R8 are arranged on a line connecting the output capacitors C5 and C7 or on a line connecting the output capacitors C6 and C8.

Here, the resistors R6 and R1 are arranged in proximity to each other on the connecting line and inside the annular shape so that the resistors R6 and R1 are in proximity to the input capacitor C5. Further, the resistors R7 and R2 are arranged in proximity to each other on the connecting line and inside the annular shape so that the resistors R7 and R2 are arranged in proximity to the input capacitor C6.

Similarly, the resistors R8 and R3 are arranged in proximity to each other in an area that is on the connecting line and inside the annular shape so that the resistors R8 and R3 are in proximity to the input capacitor C7. The resistors R5 and R4 are arranged in proximity to each other on the connecting line and in the annular shape so that the resistors R4 and R5 are in proximity to the input capacitor C8. Note that each of the output resistors R5–R8 are arranged to be closer to a corresponding one the output capacitors C5–C8 than a corresponding one of the input resistors are.

With the above arrangement of the capacitors C1–C8 and the resistors R1–R8, the electronic circuit shown in FIG. 2 is structured so that circuit components are arranged in symmetric relation. Consequently, wiring lengths between corresponding circuit components are approximately equal, which helps to reduce undesirable deviation in phase. In addition, the overall wiring lengths are shortened so that the resulting integrated circuit device will be of compact in size.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. An integrated circuit device in which a 90-degree phase shifter is implemented, the 90-degree phase shifter including:

a plurality of capacitors each being composed of a pair of electrodes, the pair of electrodes being arranged to be opposed to each other in a laminating direction; and a plurality of resistors each being composed of a pair of electrodes, the pair of electrodes being arranged to be opposed to each other with a resistance film sandwiched therebetween, wherein the capacitors and the resistors together form an input shifter and an output shifter that are cascaded, the capacitors constituting the input shifter and the capacitors constituting the output shifter are alternately arranged in a loop-shape array in plan view, and the resistors constituting the input shifter and the resistors constituting the output shifter are arranged inside the loop-shape array in radial symmetric relation.

2. The integrated circuit device of claim 1, wherein the capacitors and the resistors that constitute the input shifter are respectively four in number, and the capacitors and the resistors that constitute the output shifter are respectively four in number.

3. The integrated circuit device of claim 1, wherein each capacitor constituting the input shifter is taken as a pair with one of the capacitors constituting the output shifter, each pair of capacitors being next to each other on the substrate, and each pair of capacitors is connected to each other in series by a lower-positioned electrode of one capacitor being connected to an upper-positioned electrode of the other capacitor with a via.

4. The integrated circuit device of claim 1, wherein the loop-shape array in which the capacitors are arranged is a square in plan view with the capacitors arranged three by three on each side of the square.

5. The integrated circuit device of claim 4, wherein the 90-degree phase shifter includes a square-shaped conductive land arranged centrally of the square area encircled by the capacitors, and the resistors are so arranged that each area between a side of the conductive land and a capacitor located outward the side includes two resisters connected to each other in series, one of the two resistors being a resistor constituting the input shifter and the other being a resistor constituting the output shifter.

6. A compact integrated circuit device in which a 90-degree phase shifter is implemented for a design frequency of 1 gigahertz or higher, the 90-degree phase shifter comprising:

four input capacitors all having equal capacitance, four input resistors, four output capacitors all having equal capacitance, and four output resistors, wherein the input capacitors and input resistors, and the output capacitors and output resistors are arranged alternately in a loop-shape array in plan view on a multi-layered circuit board substrate with electrical connections of equal length and size; and a plurality of sandwiching electrodes on different layers of the circuit board substrate of equal size to overlay equal size capacitor material and resistance material that form the respective capacitors and resistors of the 90-degree phase shifter.

7. The integrated circuit device of claim 6, wherein each input capacitor is connected to one of the output capacitors electrically in series without any other circuit component therebetween, and each input capacitor and an output capacitor connected are arranged next to each other in the loop-shape array.

8. The integrated circuit device of claim 6, wherein the input resistors and the output resistors are all arranged inside the loop-shape array.

9. The integrated circuit device of claim 8, wherein each input resistor is connected to one of the output resistors electrically in series without any other circuit component therebetween, each input resistor and an output resistor connected are arranged in spatial proximity to each other, and each input resistor is spatially closer to an input capacitor than a corresponding output resistor is to the input capacitor.

10. The integrated circuit device of claim 6, wherein each input resistor is connected to one of the output resistors electrically in series without any other circuit component therebetween, each input resistor and an output resistor connected to the input resistor are in spatial proximity to each other, and each output resistor is spatially closer to an output capacitor than a corresponding input resistor is to an output capacitor.

11. The integrated circuit device of claim 10, wherein the four input resistors all have equal resistance, and the four output resistors all have equal resistance.

* * * * *